United States Patent
Asaine

(10) Patent No.: US 7,527,830 B2
(45) Date of Patent: May 5, 2009

(54) PREPARATION OF HEAT TRANSFER MEMBER AND HEAT-DISSIPATING STRUCTURE

(75) Inventor: Masaya Asaine, Usui-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 391 days.

(21) Appl. No.: 11/297,481

(22) Filed: Dec. 9, 2005

(65) Prior Publication Data

US 2006/0154087 A1    Jul. 13, 2006

(30) Foreign Application Priority Data

Dec. 27, 2004  (JP)  ............................. 2004-377055

(51) Int. Cl.
*B05D 3/02* (2006.01)
(52) U.S. Cl. .................. 427/387; 428/447; 528/32; 528/31; 528/25
(58) Field of Classification Search .............. 528/32, 528/31, 25; 427/387; 428/447
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 5,932,145 A | * 8/1999 | Mitani et al. | ................. 252/511 |
| 6,344,104 B1 | 2/2002 | Sekiya et al. | |
| 6,657,297 B1 | 12/2003 | Jewram et al. | |

FOREIGN PATENT DOCUMENTS

| | | |
|---|---|---|
| JP | 2002-33427 | 1/2002 |
| JP | 2002-261206 | 9/2002 |

\* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A heat transfer member is prepared by applying a silicone composition onto a substrate to form an uncured silicone coating, and heat curing the coating to form a silicone heat conductor including a cured skin layer on the outer surface side and a low hardness layer on the inner surface side. The silicone composition comprises (a) an organopolysiloxane having alkenyl groups, (b) a heat conductive filler, (c) an organohydrogenpolysiloxane having Si—H groups, (d) an addition reaction catalyst, and (e) a volatile compound having one alkenyl group allowing for addition of an Si—H group thereto.

8 Claims, No Drawings

PREPARATION OF HEAT TRANSFER MEMBER AND HEAT-DISSIPATING STRUCTURE

CROSS-REFERENCE TO RELATED APPLICATION

This application claims priority under 35 U.S.C. § 119 to Japanese Patent Application No. 2004-377055, filed December 27, 2004.

This non-provisional application claims priority under 35 U.S.C. §119(a) on Patent Application No. 2004-377055 filed in Japan on Dec. 27, 2004, the entire contents of which are hereby incorporated by reference.

TECHNICAL FIELD

This invention relates to a method for preparing a heat transfer member using a silicone composition loaded with a heat conductive filler. The heat transfer member is interposed between a thermal interface of a heat-generating electronic component and a heat-dissipating member such as a heat sink or circuit board for dissipating the heat produced within the electronic component. The invention also relates to a heat-dissipating structure comprising the same.

BACKGROUND ART

Now that CPUs, driver ICs, memories and other electronic chips used in electronic equipment have made great progress toward higher performance, higher operating speed, size reduction and higher integration, they generate large amounts of heat by themselves. A temperature ramp of a chip by such heat causes malfunction and even failure to the chip. Thus, a number of heat dissipating techniques and heat dissipating members used therefore have been proposed for restraining the chip from a temperature rise during operation.

In prior art electronic equipment or the like, heat-dissipating members using metal plates having a high heat conductivity such as aluminum or copper, often referred to as heat sinks, are used in combination with heat-generating members for restraining any temperature rise in the heat-generating members during operation. One approach for facilitating the transfer of the heat produced within the heat-generating member to the heat-dissipating member is to interpose a flexible sheet between the heat-generating member and the heat-dissipating member. This sheet ensures efficient heat transfer from the heat-generating member to the heat-dissipating member.

In this regard, an increased degree of contact between the sheet and the heat-generating and dissipating members reduces the contact thermal resistance and increases the efficiency of heat dissipation. In the event the sheet has a high hardness, a higher stress must be applied to the sheet and the heat-generating and dissipating members in order to bring them in closer contact for reducing the contact thermal resistance, but can have detrimental impact on both the members.

If the sheet has a low hardness, then the degree of contact between the sheet and the heat-generating and dissipating members can be increased without applying a substantial stress. However, the low hardness sheet is known to have the drawbacks that the sheet can be stretched during handling and the sheet is awkward to handle due to increased tack on the surface.

To solve these problems, a combination technique was employed such as by laying a low hardness sheet on a high hardness sheet. This technique enables to manufacture a composite sheet which is easy to handle and provides a high degree of contact under low stress conditions. This technique, however, requires complex and time-consuming steps for the manufacture, leading to the drawbacks of reduced yields and increased costs.

For the related technology, reference should be made to JP-A 2002-33427 and JP-A 2002-261206.

DISCLOSURE OF THE INVENTION

An object of the invention is to provide a method for preparing through a simple step a heat transfer member which provides for tight contact and easy handling and is interposed between a heat-generating member such as an electronic component and a heat-dissipating member. Another object is to provide a heat-dissipating structure comprising the same.

The inventors have discovered that by applying a silicone composition comprising (a) an organopolysiloxane having at least two alkenyl groups on the molecule, (b) a heat conductive filler, (c) an organohydrogenpolysiloxane having on the average at least two silicon-bonded hydrogen atoms (i.e., Si—H groups) on the molecule, (d) a platinum group base addition reaction catalyst, and (e) a volatile compound having on the molecule one alkenyl group allowing for addition of an Si—H group thereto, onto a substrate to form an uncured silicone coating having an inner surface contiguous to the substrate and an outer surface open to the ambient and heat curing the coating, a silicone heat conductor including a cured skin layer on the outer surface side and a buffer layer having a lower degree of curing and a lower hardness than the cured skin layer on the inner surface side is obtained in substantially one step. When this silicone heat conductor is disposed between a heat-generating member such as an electronic component and a heat-dissipating member, it provides for efficient heat transfer along with the advantages of close contact and ease of handling.

Accordingly, the present invention provides a method for preparing a heat transfer member, comprising the steps of applying a heat conductive silicone composition comprising components (a) to (e) onto a substrate to form an uncured silicone coating having an outer surface and an inner surface contiguous to the substrate, and heat curing the uncured silicone coating to form a silicone heat conductor including a cured skin layer on the outer surface side and a layer having a lower hardness than said cured skin layer on the inner surface side. The heat conductive silicone composition comprises (a) 100 parts by weight of an organopolysiloxane having at least two alkenyl groups on the molecule, (b) 300 to 5,000 parts by weight of a heat conductive filler, (c) an organohydrogenpolysiloxane having on the average at least two silicon-bonded hydrogen atoms (i.e., Si—H groups) on the molecule, in such an amount that a molar ratio of Si—H groups in component (c) to alkenyl groups in component (a) falls in a range of 0.5 to 10.0, (d) a platinum group base addition reaction catalyst in such an amount as to give 0.1 to 1,000 ppm of platinum group metal element based on the weight of component (a), and (e) a volatile compound having on the molecule one alkenyl group allowing for addition of an Si—H group thereto, in such an amount that a molar ratio of alkenyl groups in component (e) to Si—H groups in component (c) falls in a range of 0.01 to 1.5.

Also contemplated herein is a heat-dissipating structure wherein the low hardness layer of the heat transfer member prepared by the inventive method is in contact with a heat-generating member.

With the method of the present invention, a heat transfer member having efficient heat transfer, close contact and ease of handling can be manufactured simply in substantially one step.

DESCRIPTION OF THE PREFERRED EMBODIMENT

In preparing a heat transfer member according to the invention, a heat conductive silicone composition is used comprising (a) an organopolysiloxane having at least two alkenyl groups on the molecule, (b) a heat conductive filler, (c) an organohydrogenpolysiloxane having on the average at least two silicon-bonded hydrogen atoms (i.e., Si—H groups) on the molecule, (d) a platinum group base addition reaction catalyst, and (e) a volatile compound having on the molecule one alkenyl group allowing for addition of an Si—H group thereto.

Component (a) used herein is an organopolysiloxane having at least two alkenyl groups on the molecule. Often, it preferably has a main chain portion composed essentially of recurring diorganosiloxane units. Illustrative examples of component (a) include organopolysiloxanes of the general formulae (1) to (3).

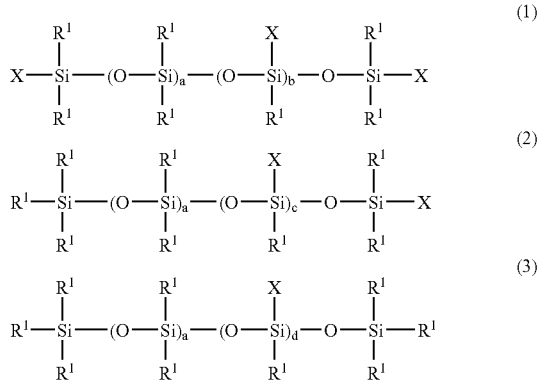

Herein $R^1$ is each independently an aliphatic unsaturation-free, substituted or unsubstituted, monovalent hydrocarbon group, X is an alkenyl group, the subscripts a and b each are an integer of at least 0, c is an integer of at least 1, and d is an integer of at least 2.

Suitable aliphatic unsaturation-free, substituted or unsubstituted, monovalent hydrocarbon groups represented by $R^1$ are typically those of 1 to 10 carbon atoms, more typically 1 to 6 carbon atoms, and include, but are not limited to, alkyl groups such as methyl, ethyl, propyl, isopropyl, butyl, isobutyl, tert-butyl, pentyl, neopentyl, hexyl, heptyl, octyl, nonyl, decyl and dodecyl; cycloalkyl groups such as cyclopentyl, cyclohexyl and cycloheptyl; aryl groups such as phenyl, tolyl, xylyl, naphthyl, and biphenylyl; aralkyl groups such as benzyl, phenylethyl, phenylpropyl, and methylbenzyl; and substituted forms of the foregoing groups in which some or all hydrogen atoms attached to carbon atoms are replaced by halogen atoms (e.g., fluoro, chloro, bromo) or cyano groups, such as chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl. Of these, substituted or unsubstituted alkyl groups of 1 to 3 carbon atoms such as methyl, ethyl, propyl, 3,3,3-trifluoropropyl and cyanoethyl, and phenyl groups are preferred. Methyl and phenyl are more preferred, with the methyl being most preferred. All groups of $R^1$ may be the same or different.

Suitable alkenyl groups represented by X are generally those of about 2 to about 8 carbon atoms, and include, but are not limited to, vinyl, allyl, propenyl, isopropenyl, butenyl, hexenyl, and cyclohexenyl. Of these, lower alkenyl groups such as vinyl and allyl are preferred, with the vinyl being most preferred. It is unnecessary that all groups of X on the molecule be the same.

The subscript a is an integer of at least 0, preferably satisfying $10 \leq a \leq 10,000$, more preferably satisfying $50 \leq a \leq 2,000$, even more preferably satisfying $100 \leq a \leq 1,000$. The subscript b is an integer of at least 0, desirably satisfying $0 \leq b/(a+b) \leq 0.5$, more desirably satisfying $0 \leq b/(a+b) \leq 0.1$. The subscript c is an integer of at least 1, desirably satisfying $0 < c/(a+c) \leq 0.5$, more desirably satisfying $0 < c/(a+c) \leq 0.1$. The subscript d is an integer of at least 2, desirably satisfying $0 < d/(a+d) \leq 0.5$, more desirably satisfying $0 < d/(a+d) \leq 0.1$.

The organopolysiloxanes may be used singly or in admixture of two or more.

Component (b) is a heat conductive filler. Suitable fillers used herein include materials commonly used as the heat conductive filler, for example, nonmagnetic metals such as copper and aluminum, metal oxides such as alumina, silica, magnesia, red iron oxide, beryllia, titania, and zirconia, metal nitrides such as aluminum nitride, silicon nitride and boron nitride, synthetic diamond, and silicides such as silicon carbide.

The heat conductive filler is in particle form and may have an average particle size of 0.1 to 100 μm, desirably 0.2 to 50 μm, more desirably 0.5 to 30 μm. With an average particle size of less than 0.1 μm, some compositions may have too high a viscosity to form. With an average particle size of more than 100 μm, some formed compositions may not have smooth surfaces and desired thermal properties. The fillers may be used singly or in admixture of two or more. Use may also be made of a mixture of two or more groups of particles having a different average particle size. As used herein, the "average particle size" is determined as a weight average value or median diameter in particle size distribution measurement, typically by the laser light diffraction method.

An appropriate amount of the heat conductive filler (b) compounded is 300 to 5,000 parts by weight, preferably 500 to 3,000 parts by weight per 100 parts by weight of component (a). With too much amounts of the filler, it becomes difficult for the cured composition to acquire the desired flexibility, thus failing to achieve the desired tight contact. Too small amounts of the filler fail to provide the desired heat transfer.

Component (c) is an organohydrogenpolysiloxane having on the average at least two silicon-bonded hydrogen atoms (i.e., Si—H groups) on the molecule. Suitable organohydrogenpolysiloxanes include those of the average structural formulae (4) to (6), which may be used singly or in admixture of two or more.

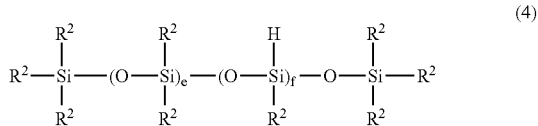

-continued

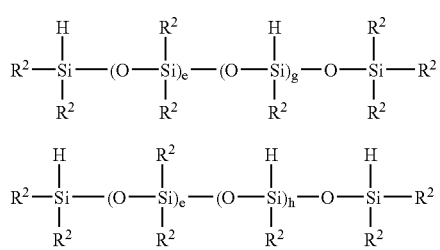

Herein $R^2$ is each independently an aliphatic unsaturation-free, substituted or unsubstituted, monovalent hydrocarbon group, the subscripts e, f, g and h each are a positive number of at least 0.

In formulae (4) to (6), suitable aliphatic unsaturation-free, substituted or unsubstituted, monovalent hydrocarbon groups represented by $R^2$ are typically those of 1 to 10 carbon atoms, more typically 1 to 6 carbon atoms, and include, but are not limited to, alkyl groups such as methyl, ethyl, propyl, isopropyl, butyl, isobutyl, tert-butyl, pentyl, neopentyl, hexyl, heptyl, octyl, nonyl, decyl and dodecyl; cycloalkyl groups such as cyclopentyl, cyclohexyl and cycloheptyl; aryl groups such as phenyl, tolyl, xylyl, naphthyl, and biphenylyl; aralkyl groups such as benzyl, phenylethyl, phenylpropyl, and methylbenzyl; and substituted forms of the foregoing groups in which some or all hydrogen atoms attached to carbon atoms are replaced by halogen atoms (e.g., fluoro, chloro, bromo) or cyano groups, such as chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl. Of these, substituted or unsubstituted alkyl groups of 1 to 3 carbon atoms such as methyl, ethyl, propyl and 3,3,3-trifluoropropyl, and phenyl groups are preferred. It is not required that all groups of $R^2$ be the same.

In formulae (4) to (6), the subscript e is a positive number inclusive of 0, preferably 1 to 100. Each of f, g and h is a positive number inclusive of 0. Desirably, f is a positive number of at least 2, g is a positive number of at least 1, and h is a positive number of more than 0. More desirably, f is a positive number of 4 to 100, g is a positive number of 3 to 100, and h is a positive number of 2 to 100.

Component (c) is compounded in such an amount that a molar ratio of Si—H groups in component (c) to alkenyl groups in component (a) falls in a range of 0.5:1 to 10.0:1, preferably 0.8:1 to 5.0:1. With a ratio of less than 0.5, the composition becomes under-cured. With a ratio of more than 10.0, the composition can foam upon forming.

Component (d) is a platinum group base addition reaction catalyst which serves to promote the addition reaction between alkenyl groups in component (a) and Si—H groups in component (c). There may be used any of well-known catalysts commonly used in hydrosilylation reaction. Examples include elemental platinum group metals such as platinum (inclusive of platinum black), rhodium and palladium, platinum chlorides such as $H_2PtCl_4.nH_2O$, $H_2PtCl_6.nH_2O$, $NaHPtCl_6.nH_2O$, $KHPtCl_6.nH_2O$, $Na_2PtCl_6.nH_2O$, $K_2PtCl_4.nH_2O$, $PtCl_4.nH_2O$, $PtCl_2$, and $Na_2HPtCl_4.nH_2O$, wherein n is an integer of 0 to 6, preferably 0 or 6, chloroplatinic acid and chloroplatinic acid salts, alcohol-modified chloroplatinic acids (see U.S. Pat. No. 3,220,972), complexes of chloroplatinic acid with olefins (see U.S. Pat. No. 3,159,601, U.S. Pat. No. 3,159,662, and U.S. Pat. No. 3,775,452), platinum group metals such as platinum black and palladium on supports such as alumina silica and carbon, rhodium-olefin complexes, chlorotris(triphenylphosphine) rhodium (Wilkinson catalyst), and complexes of platinum chloride, chloroplatinic acid or chloroplatinic acid salt with vinyl-containing siloxanes, especially vinyl-containing cyclic siloxanes.

Component (d) is used in a catalytic amount, usually in an amount to give about 0.1 to 1,000 ppm, desirably about 0.5 to 500 ppm, more desirably about 1.0 to 200 ppm of platinum group element based on the weight of component (a). Less than 0.1 ppm is too small for the composition to cure whereas more than 1,000 ppm is uneconomical.

Component (e) is a volatile compound having on the molecule one alkenyl group allowing for addition of an Si—H group thereto. It helps form a skin layer on the outer surface side of the heat transfer member. The volatile compound used herein is not particularly limited as long as it volatilizes off from the surface of the formed composition during heat forming although it is preferably selected from among silane compounds, low molecular weight siloxane compounds and hydrocarbon compounds. The preferred volatile compounds are those having a vapor pressure of at least 10 mmHg, more preferably at least 50 mmHg at the heat forming temperature, typically about 150° C.

In one embodiment wherein the volatile compounds are silane compounds or low molecular weight siloxane compounds, those compounds of the general formulae (7) to (10) may be used.

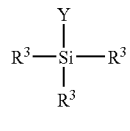

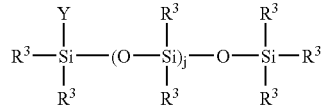

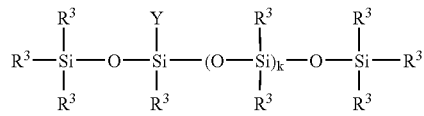

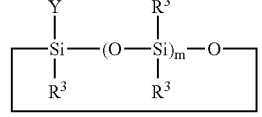

Herein $R^3$ is each independently an aliphatic unsaturation-free, substituted or unsubstituted, monovalent hydrocarbon group, Y is an alkenyl group, the subscript j is an integer of at least 0, k is an integer of at least 0, and m is an integer of at least 2.

In formulae (7) to (10), suitable aliphatic unsaturation-free, substituted or unsubstituted, monovalent hydrocarbon groups represented by $R^3$ are typically those of 1 to 10 carbon atoms, more typically 1 to 6 carbon atoms, and include, but are not limited to, alkyl groups such as methyl, ethyl, propyl, isopropyl, butyl, isobutyl, tert-butyl, pentyl, neopentyl, hexyl, heptyl, octyl, nonyl, decyl and dodecyl; cycloalkyl groups such as cyclopentyl, cyclohexyl and cycloheptyl; aryl groups such as phenyl, tolyl, xylyl, naphthyl, and biphenylyl; aralkyl groups such as benzyl, phenylethyl, phenylpropyl, and methylbenzyl; and substituted forms of the foregoing groups in which some or all hydrogen atoms attached to carbon atoms are replaced by halogen atoms (e.g., fluoro, chloro, bromo) or cyano groups, such as chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl. Of these, substituted or unsubstituted alkyl groups of 1 to 3 carbon atoms such as methyl, ethyl, propyl and 3,3,3-trifluoropropyl, and phenyl groups are preferred. It is not required that all groups of $R^3$ be the same.

Suitable alkenyl groups represented by Y are generally those of about 2 to about 8 carbon atoms, and include, but are not limited to, vinyl, allyl, propenyl, isopropenyl, butenyl, hexenyl, and cyclohexenyl. Of these, lower alkenyl groups such as vinyl and allyl are preferred, with the vinyl being most preferred.

The subscript j in formula (8) is an integer inclusive of 0. No particular upper limit is imposed on j as long as the compound is volatile, although j is preferably an integer from 0 to 2, more preferably 0 or 1, most preferably 0. The subscript k in formula (9) is an integer inclusive of 0. No particular upper limit is imposed on k as long as the compound is volatile, although k is preferably an integer from 0 to 2, more preferably 0 or 1, most preferably 0. The subscript m in formula (10) is an integer of at least 2, preferably an integer of 2 to 6, more preferably an integer of 2 to 4.

In the other embodiment wherein the volatile compounds are hydrocarbon compounds, they may be either aliphatic or aromatic as long as they have only one alkenyl group per molecule. Suitable aliphatic compounds are those of 6 to 16 carbon atoms, preferably 6 to 12 carbon atoms, more preferably 8 to 10 carbon atoms, typical of which is 1-octene. Suitable aromatic compounds include styrene and styrene derivatives.

Suitable alkenyl groups in the hydrocarbon compounds are generally those of about 2 to about 8 carbon atoms, and include, but are not limited to, vinyl, allyl, propenyl, isopropenyl, butenyl, hexenyl, and cyclohexenyl. Of these, lower alkenyl groups such as vinyl and allyl are preferred, with the vinyl being most preferred.

Component (e) is used in such an amount that a ratio of moles of alkenyl groups in component (e) to moles of Si—H groups in component (c) falls in a range of 0.01:1 to 1.5:1, desirably 0.05:1 to 1.0:1, more desirably 0.1:1 to 0.5:1. A ratio of more than 1.5 allows the composition to foam upon heat forming whereas a ratio of less than 0.01 results in a sheet which is hard in entirety.

To the silicone composition of the invention, various additives for improving certain functions may be added insofar as the objects of the invention are not impaired. Exemplary additives include, but are not limited to, reaction inhibitors for adjusting the time of curing reaction as appropriate, surface treating agents for the heat conductive filler, pigments and dyes for coloring, flame retardants, and internal release agents.

The silicone composition may be prepared by compounding the above-described components (a) to (e) and optional additives. For the compounding purpose, use may be made of a mixer adapted to combine and knead powder with liquid, for example, a planetary mixer, Shinagawa universal mixer, mixmuller, kneader, two-roll mill, three-roll mill or the like.

By a coating or similar technique, the heat conductive silicone composition is then applied onto a substrate, typically a film, to form an uncured silicone coating having an outer surface exposed to the ambient, that is, in an open state exposed to air directly, and an inner surface contiguous to the substrate, that is, in a blocked state out of contact with air.

When the coating is heated in this state, the volatile compound (e) diffuses through and volatilizes off the uncured silicone coating from its outer surface or open surface whereby alkenyl groups collect in proximity to the outer surface to increase their amount and undergo rapid addition reaction with Si—H groups on the organohydrogenpolysiloxane (c) to a sufficient extent. As a result, the surface portion cures and becomes hard, forming on the outer surface side a cured skin layer which is substantially tack-free or less tacky. On the other hand, a region inward of the outer surface portion, especially the inner surface portion contiguous to the substrate remains uncured or semi-cured, at least having a lower degree of curing than the outer surface portion. As a result, a buffer layer is formed in the soft rubbery state having a lower hardness than the cured skin layer. In this way, there is obtained a silicone heat conductor including the cured skin layer on the outside and the buffer layer with a lower hardness on the inside.

Used as the substrate is a film which is strippable from the silicone heat conductor. Suitable films include plastic films and metal films. Plastic films such as polyethylene terephthalate (PET) film, fluororesin films, and polyester films are preferred. Plastic films which are resistant to heat at the heat curing temperature of an uncured silicone coating, typically about 80° C. to about 160° C., are most preferred.

The substrate (or film) is stripped from the silicone heat conductor prior to use as a heat transfer member. Differently stated, the heat transfer member can be handled in the state attached to the substrate, that is, in the supported state, just until use. This ensures ease of handling for the heat transfer member even though the inner surface portion of the silicone heat conductor disposed contiguous to the substrate (or film) still remains soft or tacky. The film preferably has a thickness of 10 to 500 μm, more preferably 50 to 200 μm.

The uncured silicone coating and the silicone heat conductor resulting from curing thereof are preferably in the form of a sheet. It is preferred for handling and heat transfer that the sheet have a thickness of 0.1 to 10.0 mm, especially 0.3 to 5.0 mm.

In applying the silicone composition to the substrate, coating techniques such as comma coating, gravure coating, bar coating and knife coating may be employed.

For heat forming or curing, any heating means such as hot air blowing, infrared radiation heating or microwave induction heating may be employed. The heating temperature during forming is preferably in a range of 60 to 200° C., more preferably 80 to 160° C. The heating time is preferably 1 to 30 minutes, more preferably 3 to 15 minutes. Too high a heating temperature may invite the risk of foaming whereas too low a heating temperature may allow the open surface side to remain tacky. Too short a heating time may fail to induce sufficient surface curing whereas too long a heating time is uneconomical.

The thickness and hardness of the cured skin layer and a difference in hardness between the skin layer and the buffer layer can be controlled by selecting the quantities of alkenyl groups in components (a) and (e), the ratio of these alkenyl groups to Si—H groups in component (c), the heating temperature and time.

Once the silicone heat conductor is stripped from the substrate, it is ready for use as a heat transfer member. The heat transfer member is interposed between a thermal interface of a heat-generating electronic component (heat-generating member or member to be heat-dissipated) and a heat-dissipating member such as a heat sink or circuit board. The heat transfer member comes in tight contact with both the heat-generating component and the heat-dissipating component under low stress conditions, thus has a lower thermal resistance and offers improved heat dissipation. Namely since the skin layer on the outer side has a toughness enough to ensure ease of handling and the buffer layer inward of the skin layer, especially on the inner surface side is formed softer, the heat transfer member can be disposed between the heat-generating component and the heat-dissipating component in close contact therewith while it conforms to changes or steps of the components faithfully. The heat transfer member is advantageously used in such a fashion that the soft buffer layer comes in contact with the heat-generating component and the skin layer comes in contact with the heat-dissipating component.

EXAMPLE

Examples of the invention are given below by way of illustration and not by way of limitation. In the examples, the viscosity is as measured at 25° C. by Ostwald's viscometer, the average particle size is as measured by a Microtrac® particle size analyzer, and Me is methyl.

Example 1

A Shinagawa universal mixer was charged with 100 parts by weight of dimethylpolysiloxane containing vinyl groups only at both ends and having a viscosity of 10,000 mm$^2$/s and 500 parts by weight of alumina having an average particle size of 4 μm, which were mixed for 60 minutes. To the liquid base, 0.2 part by weight of a 2-ethylhexanol solution of chloroplatinic acid (2 wt % platinum), 0.1 part by weight of a 50% toluene solution of ethynyl cyclohexanol, 1.0 part by weight of vinylpentamethyldisiloxane, and 5.0 parts by weight of an organohydrogenpolysiloxane of formula (11) were added in sequence. Every time when each ingredient was added, mixing was performed for 5 minutes. Finally, mixing was performed for 5 minutes under a reduced pressure of −650 mmHg, yielding a composition "a". This composition "a" was coated onto a PET film to form a coating of 1.0 mm thick, which was allowed to stand in an atmosphere of 150° C. for 10 minutes, yielding a sheet A having a skin layer at the outer surface.

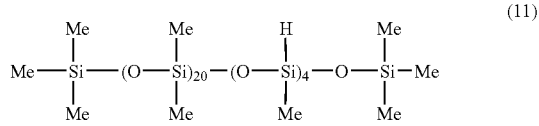

(11)

Example 2

A Shinagawa universal mixer was charged with 100 parts by weight of dimethylpolysiloxane containing vinyl groups only at both ends and having a viscosity of 10,000 mm$^2$/s and 500 parts by weight of alumina having an average particle size of 4 μm, which were mixed for 60 minutes. To the liquid base, 0.2 part by weight of a 2-ethylhexanol solution of chloroplatinic acid (2 wt % platinum), 0.1 part by weight of a 50% toluene solution of ethynyl cyclohexanol, 1.0 part by weight of styrene, and 5.0 parts by weight of the organohydrogenpolysiloxane of formula (11) were added in sequence. Every time when each ingredient was added, mixing was performed for 5 minutes. Finally, mixing was performed for 5 minutes under a reduced pressure of −650 mmHg, yielding a composition "b". This composition "b" was coated onto a PET film to form a coating of 1.0 mm thick, which was allowed to stand in an atmosphere of 150° C. for 10 minutes, yielding a sheet B having a skin layer at the outer surface.

Comparative Example 1

A Shinagawa universal mixer was charged with 100 parts by weight of dimethylpolysiloxane containing vinyl groups only at both ends and having a viscosity of 10,000 mm$^2$/s and 500 parts by weight of alumina having an average particle size of 4 μm, which were mixed for 60 minutes. To the liquid base, 0.2 part by weight of a 2-ethylhexanol solution of chloroplatinic acid (2 wt % platinum), 0.1 part by weight of a 50% toluene solution of ethynyl cyclohexanol, and 5.0 parts by weight of the organohydrogenpolysiloxane of formula (11) were added in sequence. Every time when each ingredient was added, mixing was performed for 5 minutes. Finally, mixing was performed for 5 minutes under a reduced pressure of −650 mmHg, yielding a composition "c". This composition "c" was coated onto a PET film to form a coating of 1.0 mm thick, which was allowed to stand in an atmosphere of 150° C. for 10 minutes, yielding a sheet C.

Comparative Example 2

A Shinagawa universal mixer was charged with 100 parts by weight of dimethylpolysiloxane containing vinyl groups only at both ends and having a viscosity of 10,000 mM$^2$/s and 500 parts by weight of alumina having an average particle size of 4 μm, which were mixed for 60 minutes. To the liquid base, 0.2 part by weight of a 2-ethylhexanol solution of chloroplatinic acid (2 wt % platinum), 0.1 part by weight of a 50% toluene solution of ethynyl cyclohexanol, and 2.0 parts by weight of the organohydrogenpolysiloxane of formula (11) were added in sequence. Every time when each ingredient was added, mixing was performed for 5 minutes. Finally, mixing was performed for 5 minutes under a reduced pressure of −650 mmHg, yielding a composition "d". This composition "d" was coated onto a PET film to form a coating of 1.0 mm thick, which was allowed to stand in an atmosphere of 150° C. for 10 minutes, yielding a sheet D.

Comparative Example 3

The composition "c" obtained in Comparative Example 1 was coated onto a PET film to form a coating of 0.10 mm thick, which was allowed to stand in an atmosphere of 150° C. for 10 minutes and formed into a sheet shape, yielding a sheet C'. The composition "d" obtained in Comparative Example 2 was coated onto the sheet C' to form a coating of 0.9 mm thick, which was allowed to stand in an atmosphere of 150° C. for 10 minutes, yielding a sheet E.

Comparative Example 4

An organohydrogenpolysiloxane of formula (12) was coated in a coating weight of 5 g/m$^2$ onto the open side surface of the sheet D obtained in Comparative Example 2, which was allowed to stand in an atmosphere of 150° C. for 10 minutes, yielding a sheet F.

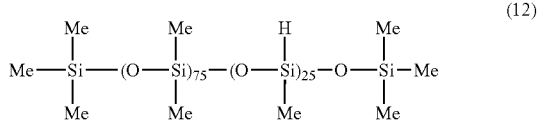

(12)

The sheets formed in these Examples and Comparative Examples were examined for surface tack and ease of handling. The repulsive stress of the sheet when compressed 20% was also measured.

A thermal resistance was measured by placing a sheet between a model heater shaped to simulate the TO-3P type transistor and a heat sink, applying a load of 29.4 kPa to bring them in pressure contact, supplying a power of 28 W across the model heater, and measuring the temperature $T_1$ (° C.) of the model heater and the temperature $T_2$ (° C.) of the heat sink after 10 minutes from the start of power supply. The thermal resistance of the sheet was calculated according to the following equation.

Thermal resistance=$(T_1-T_2)/28$

The results are shown in Tables 1 and 2.

TABLE 1

| | Example | |
|---|---|---|
| | 1 | 2 |
| Open side surface | less tacky | less tacky |
| PET side surface | fully tacky | fully tacky |
| Handling | easy | easy |
| Repulsive stress, MPa | 0.36 | 0.41 |
| Thermal resistance, ° C./W | 1.13 | 1.21 |
| Number of steps | 1 | 1 |

TABLE 2

| | Comparative Example | | | |
|---|---|---|---|---|
| | 1 | 2 | 3 | 4 |
| Open side surface | less tacky | fully tacky | fully tacky | less tacky |
| PET side surface | less tacky | fully tacky | less tacky | fully tacky |
| Handling | easy | deformed when pinched | easy | easy |
| Repulsive stress, MPa | 1.05 | 0.32 | 0.33 | 0.32 |
| Thermal resistance, ° C./W | 2.07 | 1.08 | 1.20 | 1.25 |
| Number of steps | 1 | 1 | 2 | 2 |

It has been demonstrated that according to the present invention, a sheet featuring ease of handling, a low thermal resistance, and efficient heat transfer can be manufactured in one forming step.

Japanese Patent Application No. 2004-377055 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a heat transfer member, comprising:

applying a heat conductive silicone composition onto a substrate to form an uncured silicone coating having an outer surface and an inner surface contiguous to the substrate, and heat curing the uncured silicone coating to form a silicone heat conductor comprising a cured skin layer on the outer surface side and a layer having a lower hardness than said cured skin layer on the inner surface side, wherein said heat conductive silicone composition comprises:

(a) 100 parts by weight of an organopolysiloxane having at least two alkenyl groups on the molecule, (b) 300 to 5,000 parts by weight of a heat conductive filler, (c) an organohydrogenpolysiloxane having on average at least two silicon-bonded hydrogen atoms on the molecule, in an amount that a molar ratio of Si—H groups in component (c) to alkenyl groups in component (a) is in a range of 0.5 to 10.0, (d) a platinum group base addition reaction catalyst in an amount to give 0.1 to 1,000 ppm of platinum group metal element based on the weight of component (a), and (e) a volatile silane or siloxane compound having on the molecule one alkenyl group providing for addition of an Si—H group thereto, in an amount that a molar ratio of alkenyl groups in component (e) to Si—H groups in component (c) is in a range of 0.01 to 1.5, and wherein said substrate is a plastic film which is strippable from the silicone heat conductor, and the silicone heat conductor is in the form of a sheet.

2. The method of claim 1 wherein said heat conductive filler is selected from the group consisting of metals, oxides, nitrides, silicides, synthetic diamond, and mixtures thereof.

3. A heat-dissipating structure comprising a heat-generating member and the heat transfer member prepared by the method of claim 1, wherein the low hardness layer of said heat transfer member is in contact with said heat-generating member.

4. The method for preparing a heat transfer member of claim 1, wherein the average particle size of the filler, component (b), is from 0.1 to 100 μm.

5. The method for preparing a heat transfer member of claim 1, wherein the heat conductive filler, component (b), is alumina.

6. The method for preparing a heat transfer member of claim 1, wherein the organohydrogenpolysiloxane compound, component (c), is a compound represented by formulae (4), (5), or (6):

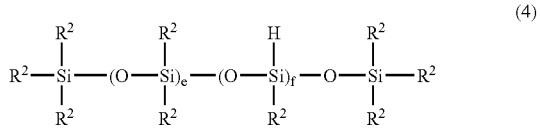

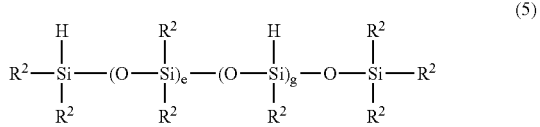

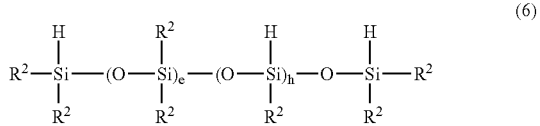

wherein $R^2$ is a $C_1$-$C_{10}$ aliphatic hydrocarbon group, e is an integer from 1 to 100, f is an integer from 4 to 100, g is an integer from 3 to 100, and h is an integer from 2 to 100.

7. The method for preparing a heat transfer member of claim 1, wherein the platinum group base addition reaction catalyst, component (d), is chloroplatinic acid.

8. The method for preparing a heat transfer member of claim 1, wherein the volatile silane or siloxane compound, component (e), is a compound represented by formulae (7), (8), (9), or (10):

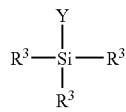
(7)
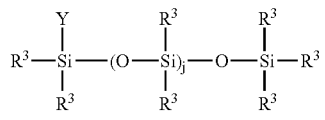
(8)
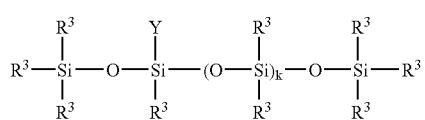
(9)
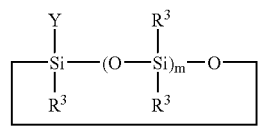
(10)
wherein Y is an alkenyl group, $R^3$ is a $C_1$-$C_{10}$ aliphatic hydrocarbon group,
j is an integer from 0 to 2,
k is an integer from 0 to 2, and
m is an integer from 2 to 6.
* * * * *